(12) United States Patent
Li

(10) Patent No.: US 9,817,264 B2
(45) Date of Patent: Nov. 14, 2017

(54) QUANTUM DOT COLOR FILTER SUBSTRATE AND MANUFACTURING METHOD THEREOF

(71) Applicant: Shenzhen China Star Optoelectronics Technology Co., Ltd., Shenzhen (CN)

(72) Inventor: Dongze Li, Shenzhen (CN)

(73) Assignee: SHENZHEN CHINA STAR OPTOELECTRONICS TECHNOLOGY CO., LTD., Shenzhen, Guangdong (CN)

(\*) Notice: Subject to any disclaimer, the term of this patent is extended or adjusted under 35 U.S.C. 154(b) by 96 days.

(21) Appl. No.: 14/914,650

(22) PCT Filed: Dec. 28, 2015

(86) PCT No.: PCT/CN2015/099263
§ 371 (c)(1),
(2) Date: Feb. 26, 2016

(87) PCT Pub. No.: WO2017/080078
PCT Pub. Date: May 18, 2017

(65) Prior Publication Data
US 2017/0256591 A1    Sep. 7, 2017

(30) Foreign Application Priority Data

Nov. 13, 2015  (CN) .......................... 2015 1 0780914

(51) Int. Cl.
*G02F 1/1335* (2006.01)
*G02F 1/00* (2006.01)
(Continued)

(52) U.S. Cl.
CPC .. *G02F 1/133516* (2013.01); *G02F 1/133514* (2013.01); *H01L 33/504* (2013.01);
(Continued)

(58) Field of Classification Search
None
See application file for complete search history.

(56) References Cited

U.S. PATENT DOCUMENTS 8,684,546 B2 \* 4/2014 Ninan ................ G02B 27/2264
362/612
9,354,465 B2 \* 5/2016 Guo .................. G02F 1/133514
(Continued)

FOREIGN PATENT DOCUMENTS

CN    104460103 A    3/2015

*Primary Examiner* — Joseph Schoenholtz
(74) *Attorney, Agent, or Firm* — Leong C. Lei

(57) ABSTRACT

The invention discloses a QD CF substrate and manufacturing method thereof. The manufacturing method uses a patterned photo-resist layer as a masking layer to perform selective quenching on QD layer with a quencher to obtain selectively quenched QD layer, which simplifies QD CF substrate manufacturing process and reduces cost. The QD CF substrate does not use blue QD material in QD layer, but uses blue backlight and organic transparent photo-resist layer to improve light utilization efficiency and reduce material cost. The QD layer is a selectively quenched QD layer, and the portion of the QD layer located above the organic transparent photo-resist layer is quenched by the quencher, and will not emit light when excited by backlight. As such, the invention achieves using the QD material to improve color gamut and brightness, avoid color impurity at blue sub-pixels caused by light mixture, and the manufacturing method is simple.

13 Claims, 4 Drawing Sheets

(51) Int. Cl.
    *G02F 1/015* (2006.01)
    *H01L 33/50* (2010.01)
    *H01L 27/32* (2006.01)

(52) U.S. Cl.
    CPC ............ *G02F 1/0063* (2013.01); *G02F 1/015* (2013.01); *G02F 2001/0155* (2013.01); *G02F 2001/133519* (2013.01); *G02F 2201/08* (2013.01); *G02F 2202/04* (2013.01); *G02F 2202/36* (2013.01); *G02F 2203/58* (2013.01); *H01L 27/322* (2013.01); *H01L 2933/0041* (2013.01)

(56) References Cited

U.S. PATENT DOCUMENTS

| | | | |
|---|---|---|---|
| 2012/0154464 A1* | 6/2012 | Ninan | G02B 27/2264 345/691 |
| 2014/0204319 A1* | 7/2014 | Cai | G02F 1/133514 349/106 |
| 2015/0301408 A1* | 10/2015 | Li | G02F 1/133621 362/84 |
| 2015/0318506 A1* | 11/2015 | Zhou | G02B 5/20 257/40 |
| 2015/0329774 A1* | 11/2015 | Gu | C09K 11/06 252/301.33 |

\* cited by examiner

US 9,817,264 B2

QUANTUM DOT COLOR FILTER SUBSTRATE AND MANUFACTURING METHOD THEREOF

BACKGROUND OF THE INVENTION

1. Field of the Invention

The present invention relates to the field of display, and in particular to a quantum dot (QD) color filter (CF) substrate and manufacturing method thereof.

2. The Related Arts

As technology continues to develop, the users demand higher display quality. The liquid crystal display (LCD) TV currently available can show a gamut between 68%-72% NTSC (National Television Standards Committee), and therefore cannot provide high quality color display. To improve the color gamut of LCD TV, the high color gamut backlight technology is becoming the focus of research in the industry.

When the semiconductor material decreases the size to a certain critical size (1-20 nm), the carrier wave property becomes significant, and the movement will be limited to result in an increase in the kinetic energy. The corresponding electron structure changes from a continuous energy level structure to a quasi-split discontinuity structure, a phenomenon known as quantum size effect. The more common semiconductor quantum dot nano-particles, i.e., quantum dots (QD) are the Group II-VI, II-V and Group IV-VI Group QD. These groups of QD observe the quantum size effect, and the property changes regularly with the size, for example, the absorption and emission wavelength change as the size changes. Therefore, the semiconductor QD plays an important role in the applications of lighting, displays, lasers and biological fluorescent markings.

With the advantages of QD material properties, such as, having a concentrated emission spectrum, high color purity, and the luminescent color adjustable by size, structure or composition of the QD material applied to the display, the display can effectively improve the color gamut and color reproduction capability. The currently available QD television is the best embodiment of the material applied to the display. However, the known technology is mainly focused on the QD film or QD tube made by mixing and sealing the light-emitting band R (red) G (green) B (blue) quantum dots in plastic film or glass, and placing the QD film or QD tube between the backlight and display system, using the conventional white backlight to excite to achieve the rich color gamut. The above technology is currently more mature, but to a certain extent, there are still problems to be improved, for example, regardless of the structure used (i.e., QD film or QD tube), the amount of QD material is relatively large, and the use of white backlight to excite the mixed QD will cause a decline in light utilization efficiency.

SUMMARY OF THE INVENTION

The object of the present invention is to provide a manufacturing method for a QD CF substrate, which uses photo-resist layer as a masking layer to perform selective quenching on the QD layer with a quencher to simplify the QD CF substrate manufacturing process and reduce production costs.

Another object of the present invention is to provide a QD CF substrate, which can meet the demands on high color gamut in display, as well as simplifying the QD CF substrate manufacturing process and reducing production costs.

To achieve the above object, the present invention provides a manufacturing method for QD CF substrate, which comprises:

Step 1: providing a substrate, the substrate comprising: red sub-pixel areas, green sub-pixel areas, and blue sub-pixel areas;

Step 2: forming a patterned red color-resist layer and a green color-resist layer, and an organic transparent color-resist layer respectively on the corresponding red sub-pixel areas, green sub-pixel areas, and blue sub-pixel areas of the substrate to obtain a color filter (CF) layer comprising a red color-resist layer, a green color-resist layer and an organic transparent layer; forming a photo-resist protective layer on the CF layer;

Step 3: coating a layer of QD solution on the photo-resist protective layer, the QD solution being obtained by dispersing the treated oil-soluble red and green QD material in a solvent; heating the QD solution of to make the solvent volatile; repeating the steps of coating QD solution and heating to make solvent volatile a plurality of times to obtain a QD layer of uniform thickness;

Step 4: providing an organic transparent photo-resist material on the QD layer, using a lithography etching process to pattern the organic transparent photo-resist material, removing the portion of the organic transparent photo-resist material located above the blue sub-pixel areas to obtain a photo-resist layer;

Step 5: using the photo-resist layer as a masking layer to use a quencher able to quench QD fluorescence on the QD layer to perform selective quenching, wherein the QD layer located above the red sub-pixel areas and green sub-pixel areas not affected by the quenching due to the shielding by the photo-resist layer to become a first QD layer, and the QD material in the QD layer located above the blue sub-pixel areas being quenched because not covered by photo-resist layer, and becoming a second QD layer;

Step 6: coating a curing gel on the photo-resist layer and the QD layer; the curing gel forming a protective layer with the photo-resist layer after curing.

The solvent of QD solution is petroleum ether, methylene chloride, or ethyl acetate.

The QD material in the QD solution is one or more of the II-VI group QD material and III-V group QD material.

The QD material in the QD solution is one or more of $ZnCdSe_2$, CdSe, CdTe, InP, and InAs.

In Step 3, the thickness of the QD layer is 0.5-5 um.

In Step 5, the quencher is organic agent able to absorb electrons.

The quencher is a 12-alkyl mercaptan, a 14-alkyl mercaptan, or a pyridine non-polar solution; the concentration of the quencher is 0.2-4 mol/L.

The present invention also provides a QD CF substrate, which comprises: a substrate, a CF layer disposed on the substrate, a color-resist protective layer disposed on the CF layer, a QD layer disposed on the color-resist protective layer, and a protective layer disposed on the QD layer;

the substrate comprising: red sub-pixel areas, green sub-pixel areas, and blue sub-pixel areas; the CF layer comprising a red color-resist layer, a green color-resist layer and an organic transparent layer disposed respectively on the corresponding red sub-pixel areas, green sub-pixel areas, and blue sub-pixel areas;

the QD layer comprising: a first QD layer located on the red sub-pixel areas and green sub-pixel areas, and a second QD layer located on the blue sub-pixel areas; the QD layer being formed by making a solvent volatile from a QD solution mixing a red QD material and a green QD material;

the red QD material and the green QD material in the first QD layer emitting red and green light respectively under the excitement by blue light; the QD material in the second QD layer not emitting light when excited; the QD CF substrate being used to a display using blue backlight.

The display is an LCD, an OLED display, or a QLED display.

The thickness of the QD layer is 0.5-5 um.

The present invention also provides a manufacturing method for QD CF substrate, which comprises:

Step 1: providing a substrate, the substrate comprising: red sub-pixel areas, green sub-pixel areas, and blue sub-pixel areas;

Step 2: forming a patterned red color-resist layer and a green color-resist layer, and an organic transparent color-resist layer respectively on the corresponding red sub-pixel areas, green sub-pixel areas, and blue sub-pixel areas of the substrate to obtain a color filter (CF) layer comprising a red color-resist layer, a green color-resist layer and an organic transparent layer; forming a photo-resist protective layer on the CF layer;

Step 3: coating a layer of QD solution on the photo-resist protective layer, the QD solution being obtained by dispersing the treated oil-soluble red and green QD material in a solvent; heating the QD solution of to make the solvent volatile; repeating the steps of coating QD solution and heating to make solvent volatile a plurality of times to obtain a QD layer of uniform thickness;

Step 4: providing an organic transparent photo-resist material on the QD layer, using a lithography etching process to pattern the organic transparent photo-resist material, removing the portion of the organic transparent photo-resist material located above the blue sub-pixel areas to obtain a photo-resist layer;

Step 5: using the photo-resist layer as a masking layer to use a quencher able to quench QD fluorescence on the QD layer to perform selective quenching, wherein the QD layer located above the red sub-pixel areas and green sub-pixel areas not affected by the quenching due to the shielding by the photo-resist layer to become a first QD layer, and the QD material in the QD layer located above the blue sub-pixel areas being quenched because not covered by photo-resist layer, and becoming a second QD layer;

Step 6: coating a curing gel on the photo-resist layer and the QD layer; the curing gel forming a protective layer with the photo-resist layer after curing;

wherein the solvent of QD solution is petroleum ether, methylene chloride, or ethyl acetate;

wherein the QD material in the QD solution is one or more of the II-VI group QD material and III-V group QD material;

wherein in Step 3, the thickness of the QD layer is 0.5-5 um;

wherein in Step 5, the quencher is organic agent able to absorb electrons.

Compared to the known techniques, the present invention provides the following advantages: the present invention provides a QD CF substrate and manufacturing method thereof. The manufacturing method uses a patterned photo-resist layer as a masking layer to perform selective quenching on the QD layer with a quencher to obtain a selectively quenched QD layer, which simplifies the QD CF substrate manufacturing process and reduces production costs The QD CF substrate does not use blue QD material in the QD layer, but uses blue backlight and organic transparent photo-resist layer to improve light utilization efficiency as well as reduce material cost. Also, the QD layer is a selectively quenched QD layer, and the portion of the QD layer located above the organic transparent photo-resist layer is quenched by the quencher, and will not emit light when excited by backlight. As such, the invention achieves using the QD material to improve color gamut and brightness as well as avoid the color impurity at blue sub-pixels caused by light mixture, and the manufacturing method is simple.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
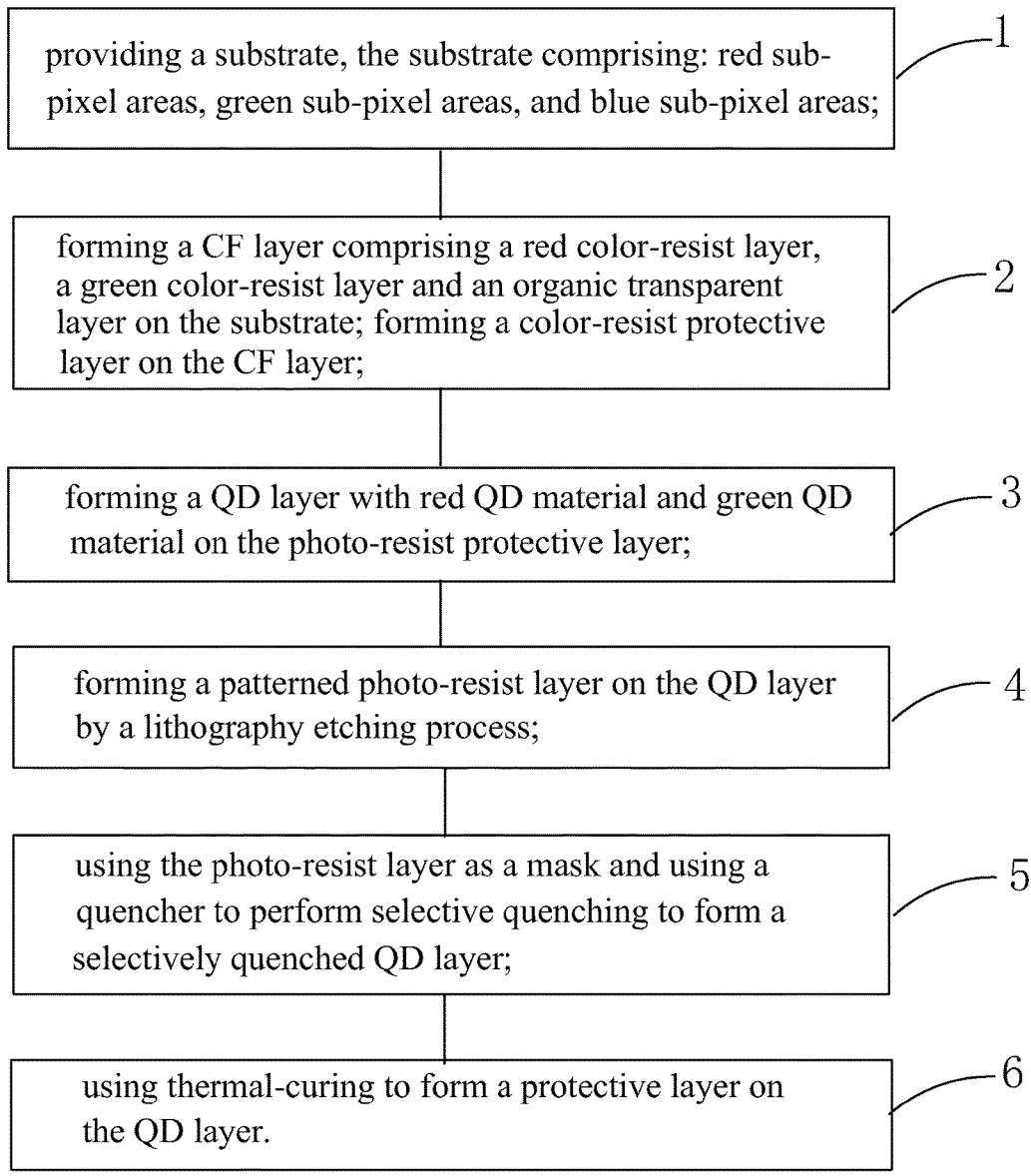
FIG. 1 is a schematic view showing the flowchart of the manufacturing method for QD CF substrate provided by an embodiment of the present invention.

Refer to FIG. 1. The present invention provides a manufacturing method for QD CF substrate, which comprises:

Step 1: providing a substrate 10, the substrate 10 comprising: red sub-pixel areas, green sub-pixel areas, and blue sub-pixel areas.

Step 2: forming a patterned red color-resist layer 21 and a green color-resist layer 22, and an organic transparent color-resist layer 23 respectively on the corresponding red sub-pixel areas, green sub-pixel areas, and blue sub-pixel areas of the substrate 10 to obtain a CF layer 20 comprising a red color-resist layer 21, a green color-resist layer 22 and an organic transparent layer 23; forming a color-resist protective layer 20' on the CF layer 20.

Figure 2:
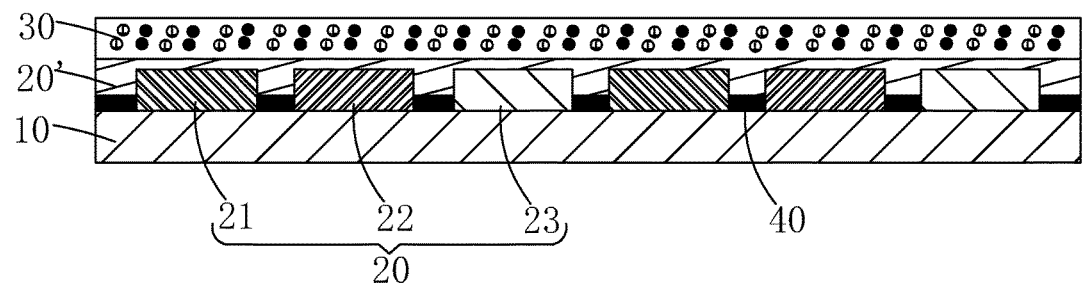
FIG. 2 is a schematic view showing Step 3 of the manufacturing method for QD CF substrate provided by an embodiment of the present invention.

Step 3: as shown in FIG. 2, coating a layer of QD solution on the photo-resist protective layer 20', the QD solution being obtained by dispersing the treated oil-soluble red and green QD material in a solvent; heating the QD solution of to make the solvent volatile; repeating the steps of coating QD solution and heating to make solvent volatile a plurality of times to obtain a QD layer 30 of uniform thickness.

Preferably, the solvent of QD solution is a solvent with low boiling temperature, such as, petroleum ether, methylene chloride, or ethyl acetate.

Specifically, the QD material in the QD solution is one or more of the II-VI group QD material and III-V group QD material; preferably, the QD material in the QD solution is one or more of $ZnCdSe_2$, CdSe, CdTe, InP, and InAs.

Specifically, in Step 3, the thickness of the QD layer is 0.5-5 um.

Figure 3:
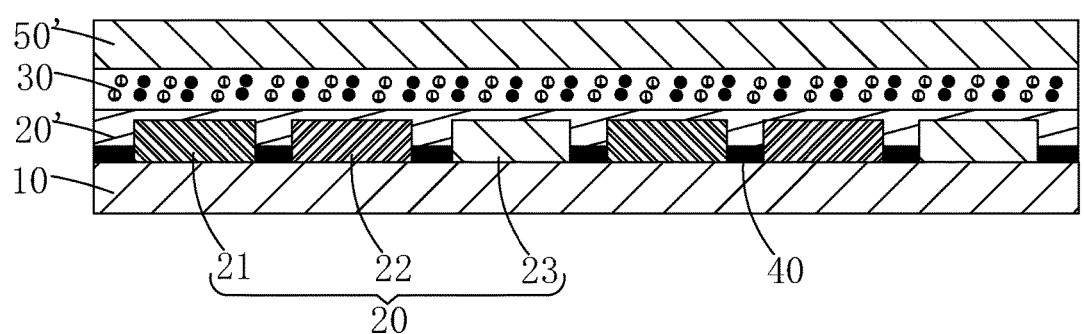
FIG. 3 is a schematic view showing the coating of organic transparent photo-resist material on the QD layer in Step 4 of the manufacturing method for QD CF substrate provided by an embodiment of the present invention.
Figure 4:
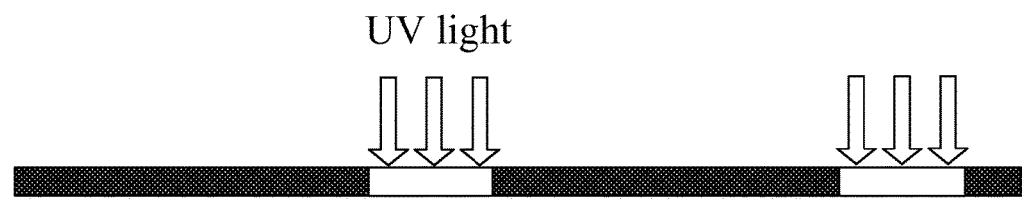
FIG. 4 is a schematic view showing the exposure of organic transparent photo-resist material on the QD layer in Step 4 of the manufacturing method for QD CF substrate provided by an embodiment of the present invention.
Figure 4:
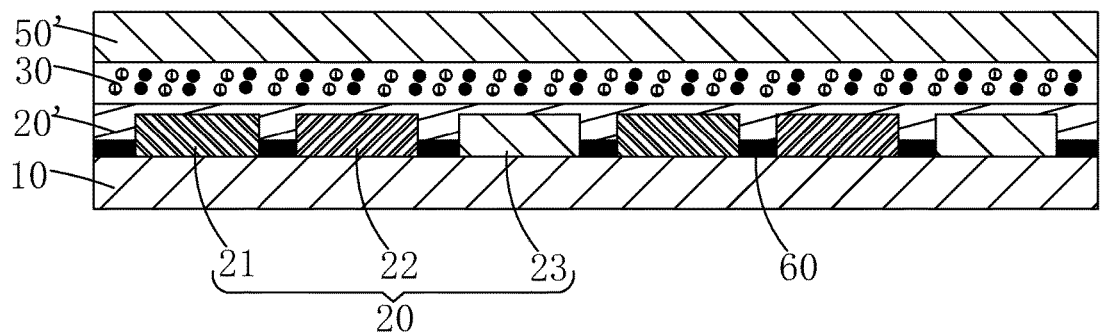
Figure 5:
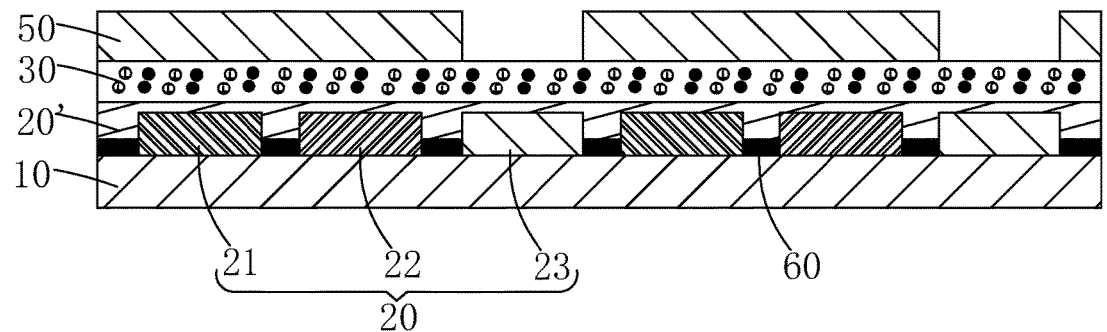
FIG. 5 is a schematic view showing the formation of photo-resist layer in Step 4 of the manufacturing method for QD CF substrate provided by an embodiment of the present invention.

Step 4: as shown in FIGS. 3-5, providing an organic transparent photo-resist material 50' on the QD layer 30, using a lithography etching process to pattern the organic transparent photo-resist material 50', removing the portion of the organic transparent photo-resist material 50' located above the blue sub-pixel areas to obtain a photo-resist layer 50.

Figure 6:
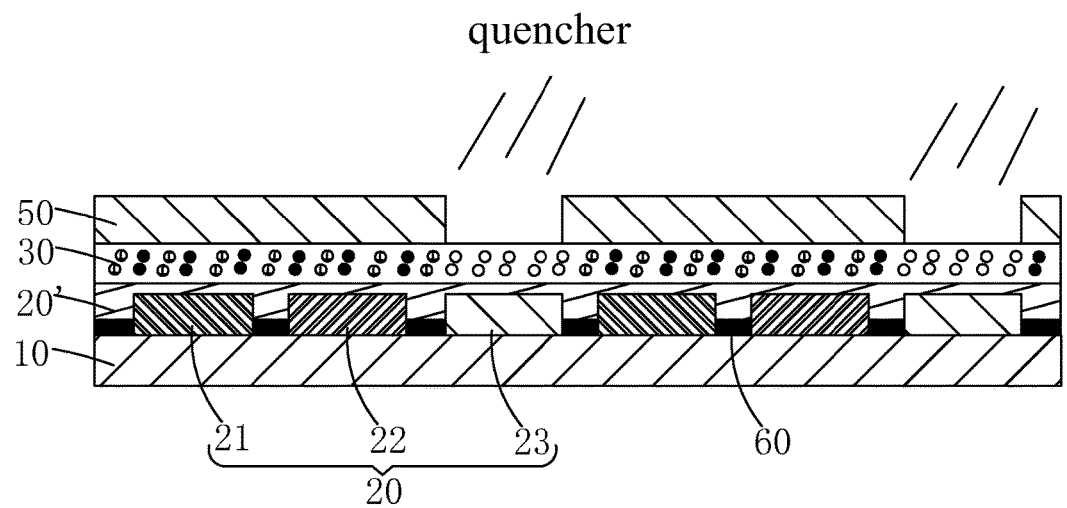
FIG. 6 is a schematic view showing Step 5 of the manufacturing method for QD CF substrate provided by an embodiment of the present invention.

Step 5: as shown in FIG. 6, using the photo-resist layer 50 as a masking layer to use a quencher able to quench QD fluorescence on the QD layer 30 to perform selective quenching, wherein the QD layer 30 located above the red sub-pixel areas and green sub-pixel areas not affected by the quenching due to the shielding by the photo-resist layer 50 to become a first QD layer 31, and the QD material in the QD layer 30 located above the blue sub-pixel areas being quenched because not covered by photo-resist layer 50, and becoming a second QD layer 32.

Specifically, in Step 5, the quencher is organic agent able to absorb electrons; preferably, the quencher is a 12-alkyl mercaptan, a 14-alkyl mercaptan, or a pyridine non-polar solution; the concentration of the quencher is 0.2-4 mol/L.

When the QD CF substrate is used in a display with blue backlight for displaying, the red QD material in the first QD layer 31 emit a red light with wavelength of 630-690 nm when excited by blue backlight, the green QD material in the first QD layer 31 emit a green light with wavelength of 500-560 nm when excited by blue backlight, and the QD material in the second QD layer 32 is a fluorescence quenched QD material, and therefore does not emit light when excited by backlight. When the QD CF substrate is applied to a display using a blue backlight for displaying, the first QD layer 31 emits a mixed red and green light, which is filtered respectively by the red color-resist layer 21 and green color-resist layer to become red light and green light; the blue backlight passes directly through the second QD layer 32 and the organic transparent color-resist layer 23 to show blue color, so as to achieve color display as well as improve color gamut index of the display. Also, and the QD layer 30 does not comprise a blue QD material, but uses the blue backlight and the organic transparent color-resist layer to improve the light utilization and reduce material costs.

Figure 7:
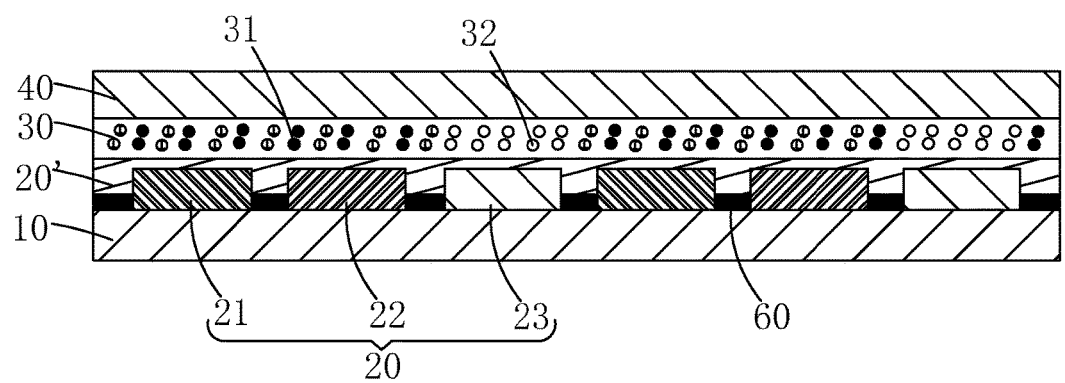
FIG. 7 is a schematic view showing Step 6 of the manufacturing method for QD CF substrate provided by an embodiment of the present invention and a cross-sectional view showing the QD CF substrate provided by an embodiment of the present invention.

Step 6: as shown in FIG. 7, for the planarization and further protection of the QD layer 30, coating directly a curing gel on the photo-resist layer 30 and the QD layer 50; the curing gel forming a protective layer 40 with the photo-resist layer 50 after curing.

The selective quenching mechanism of the present invention is, because the smaller the size of QD material is, the larger the surface area is, and the higher the weight ratio of the surface atoms to the total weight also increases; the atoms at the surface usually are more active and less stable, which is the surface effect of QD. Based on this property, the changes on the surface characteristics have great impact on the material characteristics of the QD material, wherein the optical property is the most prominent. The effects of different types of surface ligands on the QD are also different. For example, the long alkyl chain fatty amines and fatty acid, when acting on the QD surface, can effectively passivate the surface electron traps. For ligands such as pyridine or thiol, because of the electronegativity is too large, having strong electron absorption ability, once applied to the QD surface will induce the production of new surface electronic defects, which has a strong ability to attract the excited electron. To a certain extent, this will cause obstacle for photo-generated electrons and holes to recombine, resulting in fluorescence quenching. The present invention utilizes this principle, complemented by the unique structure and design process to perform selective quenching tot eh QD in the QD CF substrate structure.

As shown in FIG. 7, the present invention also provides a QD CF substrate, which comprises: a substrate 10, a CF layer 20 disposed on the substrate 10, a color-resist protective layer 20' disposed on the CF layer 20, a QD layer 30 disposed on the color-resist protective layer 20', and a protective layer 40 disposed on the QD layer 30.

The substrate 10 comprises: red sub-pixel areas, green sub-pixel areas, and blue sub-pixel areas; the CF 20 layer comprises a red color-resist layer 21, a green color-resist layer 22 and an organic transparent layer 23 disposed respectively on the corresponding red sub-pixel areas, green sub-pixel areas, and blue sub-pixel areas.

The QD layer 30 comprises: a first QD layer 31 located on the red sub-pixel areas and green sub-pixel areas, and a second QD layer 32 located on the blue sub-pixel areas. The QD layer 30 is formed by making a solvent volatile from a QD solution mixing a red QD material and a green QD material. The red QD material and the green QD material in the first QD layer 31 emits red and green light respectively under the excitement by blue light; irreversible fluorescence quenching occurring for the QD material in the second QD layer 32 under long time UV light irradiation for 3-40 hours, and the QD material in the second QD layer 32 not emitting light when excited.

The QD CF substrate is used to a display using blue backlight; specifically, the display is a liquid crystal display (LCD), an organic light-emitting diode (OLED) display, or a quantum dot light-emitting display (QLED) display.

Specifically, the thickness of the QD layer 30 is 0.5-5 um, wherein the red QD material in the first QD layer 31 emit a red light with wavelength of 630-690 nm when excited by blue backlight, the green QD material in the first QD layer 31 emit a green light with wavelength of 500-560 nm when excited by blue backlight, and the QD material in the second QD layer 32 is a fluorescence quenched QD material, and therefore does not emit light when excited by backlight. When the QD CF substrate is applied to a display using a blue backlight for displaying, the first QD layer 31 emits a mixed red and green light, which is filtered respectively by the red color-resist layer 21 and green color-resist layer to become red light and green light; the blue backlight passes directly through the second QD layer 32 and the organic transparent color-resist layer 23 to show blue color, so as to achieve color display as well as improve color gamut index of the display. Also, and the QD layer 30 does not comprise a blue QD material, but uses the blue backlight and the organic transparent color-resist layer to improve the light utilization and reduce material costs.

Specifically, the QD CF substrate further comprises a black matrix 60 disposed on the substrate 10.

Specifically, the QD material in the QD solution is one or more of the II-VI group QD material and group QD material; preferably the QD material in the QD solution is one or more of $ZnCdSe_2$, CdSe, CdTe, $InP_2$, and InAs.

In summary, the manufacturing method of the present invention uses a patterned photo-resist layer as a masking layer to perform selective quenching on the QD layer with a quencher to obtain a selectively quenched QD layer, which simplifies the QD CF substrate manufacturing process and reduces production costs The QD CF substrate does not use blue QD material in the QD layer, but uses blue backlight and organic transparent photo-resist layer to improve light utilization efficiency as well as reduce material cost. Also, the QD layer is a selectively quenched QD layer, and the portion of the QD layer located above the organic transparent photo-resist layer is quenched by the quencher, and will not emit light when excited by backlight. As such, the invention achieves using the QD material to improve color gamut and brightness as well as avoid the color impurity at blue sub-pixels caused by light mixture, and the manufacturing method is simple.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for a quantum dot (QD) color filter (CF) substrate, which comprises:
    Step 1: providing a substrate, the substrate comprising: red sub-pixel areas, green sub-pixel areas, and blue sub-pixel areas;
    Step 2: forming a patterned red color-resist layer and a patterned green color-resist layer, and a patterned organic transparent color-resist layer respectively on each of the red sub-pixel areas, each of the green sub-pixel areas, and each of the blue sub-pixel areas of the substrate to obtain a color filter (CF) layer comprising a red color-resist layer, a green color-resist layer and an organic transparent layer; and forming a photo-resist protective layer on the CF layer;
    Step 3: coating a layer of QD solution on the photo-resist protective layer, the QD solution being obtained by dispersing treated oil-soluble red and green QD materials in a solvent; heating the QD solution to make the solvent volatile; and repeating the steps of coating the QD solution and heating to make the solvent volatile a plurality of times to obtain a QD layer of uniform thickness;
    Step 4: providing an organic transparent photo-resist material on the QD layer; using a lithography etching process to pattern the organic transparent photo-resist material; and removing a portion of the organic transparent photo-resist material located above the blue sub-pixel areas to obtain a photo-resist layer;
    Step 5: using the photo-resist layer as a masking layer to use a quencher to quench QD fluorescence of the QD layer to perform selective quenching, wherein a portion of the QD layer located above the red sub-pixel areas and green sub-pixel areas is shielded by the photo-resist layer and is not quenched to become a first QD layer, and the red and green QD materials in a portion of the QD layer located above the blue sub-pixel areas are exposed through the removed portion of the organic transparent photo-resist material of the photo-resist layer and are quench to become a second QD layer; and
    Step 6: coating a curing gel on the photo-resist layer and the QD layer; the curing gel forming a protective layer with the photo-resist layer after curing.

2. The manufacturing method for QD CF substrate as claimed in claim 1, wherein the solvent of the QD solution is petroleum ether, methylene chloride, or ethyl acetate.

3. The manufacturing method for QD CF substrate as claimed in claim 1, wherein the red and green QD materials in the QD solution comprise one or more of II-VI group QD material and III-V group QD material.

4. The manufacturing method for QD CF substrate as claimed in claim 3, wherein the red and green QD materials in the QD solution comprise one or more of $ZnCdSe_2$, CdSe, CdTe, InP, and InAs.

5. The manufacturing method for QD CF substrate as claimed in claim 1, wherein in Step 3, the QD layer has a thickness that is 0.5-5 µm.

6. The manufacturing method for QD CF substrate as claimed in claim 1, wherein in Step 5, the quencher is an organic agent that absorbs electrons.

7. The manufacturing method for QD CF substrate as claimed in claim 6, wherein the quencher is a non-polar solution of 12-alkyl mercaptan, 14-alkyl mercaptan, or pyridine; and the concentration of the quencher is 0.2-4 mol/L.

8. A quantum dot (QD) color filter (CF) substrate, which comprises: a substrate, a CF layer disposed on the substrate, a color-resist protective layer disposed on the CF layer, a QD layer disposed on the color-resist protective layer, and a protective layer disposed on the QD layer;
    wherein the substrate comprising: red sub-pixel areas, green sub-pixel areas, and blue sub-pixel areas; the CF layer comprising a red color-resist layer, a green color-resist layer and an organic transparent layer disposed respectively on the each of the red sub-pixel areas, each of the green sub-pixel areas, and each of the blue sub-pixel areas;
    the QD layer comprising: a first QD layer located on the red sub-pixel areas and green sub-pixel areas, and a second QD layer located on the blue sub-pixel areas; the QD layer being formed by making a solvent volatile from a QD solution mixing a red QD material and a green QD material; the red QD material and the green QD material in the first QD layer emitting red and green light respectively under excitement by blue light; the red QD material and the green QD material in the second QD layer not emitting light when excited; and the QD CF substrate being used to a display using blue backlight.

9. The QD CF substrate as claimed in claim 8, wherein the display is an liquid crystal display (LCD), an organic light-emitting diode (OLED) display, or a quantum dot light-emitting display (QLED) display.

10. The QD CF substrate as claimed in claim 8, wherein the QD layer has a thickness that is 0.5-5 µm.

11. A manufacturing method for a quantum dot (QD) color filter (CF) substrate, which comprises:

Step 1: providing a substrate, the substrate comprising: red sub-pixel areas, green sub-pixel areas, and blue sub-pixel areas;

Step 2: forming a patterned red color-resist layer and a patterned green color-resist layer, and a patterned organic transparent color-resist layer respectively on each of the red sub-pixel areas, each of the green sub-pixel areas, and each of the blue sub-pixel areas of the substrate to obtain a color filter (CF) layer comprising a red color-resist layer, a green color-resist layer and an organic transparent layer; and forming a photo-resist protective layer on the CF layer;

Step 3: coating a layer of QD solution on the photo-resist protective layer, the QD solution being obtained by dispersing treated oil-soluble red and green QD materials in a solvent; heating the QD solution to make the solvent volatile; and repeating the steps of coating the QD solution and heating to make the solvent volatile a plurality of times to obtain a QD layer of uniform thickness;

Step 4: providing an organic transparent photo-resist material on the QD layer using a lithography etching process to pattern the organic transparent photo-resist material; and removing a portion of the organic transparent photo-resist material located above the blue sub-pixel areas to obtain a photo-resist layer;

Step 5: using the photo-resist layer as a masking layer to use a quencher to quench QD fluorescence of the QD layer to perform selective quenching, wherein a portion of the QD layer located above the red sub-pixel areas and green sub-pixel areas is shielded by the photo-resist layer and is not quenched to become a first QD layer, and the red and green QD materials in a portion of the QD layer located above the blue sub-pixel areas are exposed through the removed portion of the organic transparent photo-resist material of the photo-resist layer and are quench to become a second QD layer; and Step 6: coating a curing gel on the photo-resist layer and the QD layer; the curing gel forming a protective layer with the photo-resist layer after curing;

wherein the solvent of the QD solution is petroleum ether, methylene chloride, or ethyl acetate;

wherein the red and green QD materials in the QD solution comprise one or more of II-VI group QD material and III-V group QD material;

wherein in Step 3, the QD layer has a thickness that is 0.5-5 μm; and wherein in Step 5, the quencher is an organic agent that absorbs electrons.

12. The manufacturing method for QD CF substrate as claimed in claim 11, wherein the red and green QD materials in the QD solution comprise one or more of $ZnCdSe_2$, CdSe, CdTe, InP, and InAs.

13. The manufacturing method for QD CF substrate as claimed in claim 11, wherein the quencher is a non-polar solution of 12-alkyl mercaptan, 14-alkyl mercaptan, or pyridine; and the concentration of the quencher is 0.2-4 mol/L.

* * * * *